United States Patent
Afghahi

(10) Patent No.: US 6,204,795 B1
(45) Date of Patent: Mar. 20, 2001

(54) PROGRAMMABLE INCREMENTAL A/D CONVERTER FOR DIGITAL CAMERA AND IMAGE PROCESSING

(75) Inventor: Morteza Afghahi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/227,994

(22) Filed: Jan. 8, 1999

(51) Int. Cl.$^7$ .................................................. H03M 1/50
(52) U.S. Cl. .............................................................. 341/166
(58) Field of Search ................................... 341/166, 169, 341/155, 156, 164, 144

(56) References Cited

U.S. PATENT DOCUMENTS

| | | |
|---|---|---|
| 4,754,336 | 6/1988 | Nishizawa . |
| 4,940,982 * | 7/1990 | Gulczynski .......................... 341/169 |
| 5,706,098 * | 1/1998 | Clark et al. .......................... 358/298 |

OTHER PUBLICATIONS

Patent Abstracts of Japan, vol. 008, No. 053 (E–231), Mar. 9, 1984 & JP 58 206286 A (Sanyo Denki KK), Dec. 1, 1983 abstract.

Patent Abstracts of Japan, vol. 010, No. 011 (E–374), Jan. 17, 1986 & JP 60 174588 A (Nippon Denki KK; others: 01), Sep. 7, 1985 abstract.

* cited by examiner

*Primary Examiner*—Brian Young
(74) *Attorney, Agent, or Firm*—Blakely, Sokoloff, Taylor & Zafman LLP

(57) ABSTRACT

A method is provided having the steps of receiving a first pixel signal; generating a first set of bits representative of the first pixel signal; receiving a second pixel signal; and, generating a second set of bits representative of a difference between the first pixel signal and the second pixel signal. An apparatus and system for performing the above method is also provided.

12 Claims, 3 Drawing Sheets

PROGRAMMABLE INCREMENTAL A/D CONVERTER FOR DIGITAL CAMERA AND IMAGE PROCESSING

BACKGROUND OF THE INVENTION

1. Field of the Invention

The present invention relates to the field of use of digital imaging. More particularly, the present invention relates to analog-to-digital signal processing.

2. Description of Related Art

Digital cameras are becoming an important component of every personal computer (PC). For example, they may be used in such applications as video conferencing, document capturing, pattern recognition, process quality control, and games. Desired characteristics for these cameras include a small form factor, low power consumption and fast capture rates. Another important feature of these cameras will be the possibility of programming the resolution of either the whole image or a part of the image.

The analog to digital (A/D) converter is an strategic component in any digital camera as it often consumes a substantial part of the total power budget, occupies a large area and is a bottle neck for speed. However, if the A/D converter is properly designed, resolution programmability and many focal plane processing steps (e.g., image processing that are performed on the image sensor) may be made at conversion time.

In conventional cameras using complementary metal oxide semiconductor (CMOS) sensor arrays and integrated A/D converters, each column of pixels in the CMOS sensors has an A/D converter. When A/D converters are integrated in the same chip as the sensors, usually single slope converters are used for their simplicity and compaction. However, the size of the comparator portion of the converter circuit will not scale as well as the sensor array and other digital parts. Moreover, the power consumption of the A/D converter array is usually very high. It is also not easy to program these A/D converters for different resolutions.

One solution to the problems mentioned above is to replace the A/D array by a few or a single A/D converter. However, the resulting performance of the A/D converter of this approach, assuming a 1,000 pixel high by 1,000 pixel wide sensor array and a frame rate of 30 frames per second (fps), must be able to accommodate captures of 30 million samples per second with resolutions of up to 10 bits per sample. These requirements may be met by a single pipeline, parallel, or flash converter. But, the power consumption of these converters, although less than an A/D converter array, are still high. In addition, frame rates higher than 30 fps, even if possible, are very difficult to achieve with these converters. Thus, it is desirable to have an A/D converter which overcomes one or more of the deficiencies noted above.

SUMMARY OF THE INVENTION

In some embodiments, a method is provided having the steps of receiving a first pixel signal; generating a first set of bits representative of the first pixel signal; receiving a second pixel signal; and, generating a second set of bits representative of a difference between the first pixel signal and the second pixel signal. An apparatus and system for performing the above method is also provided.

DETAILED DESCRIPTION OF THE INVENTION

Figure 1:
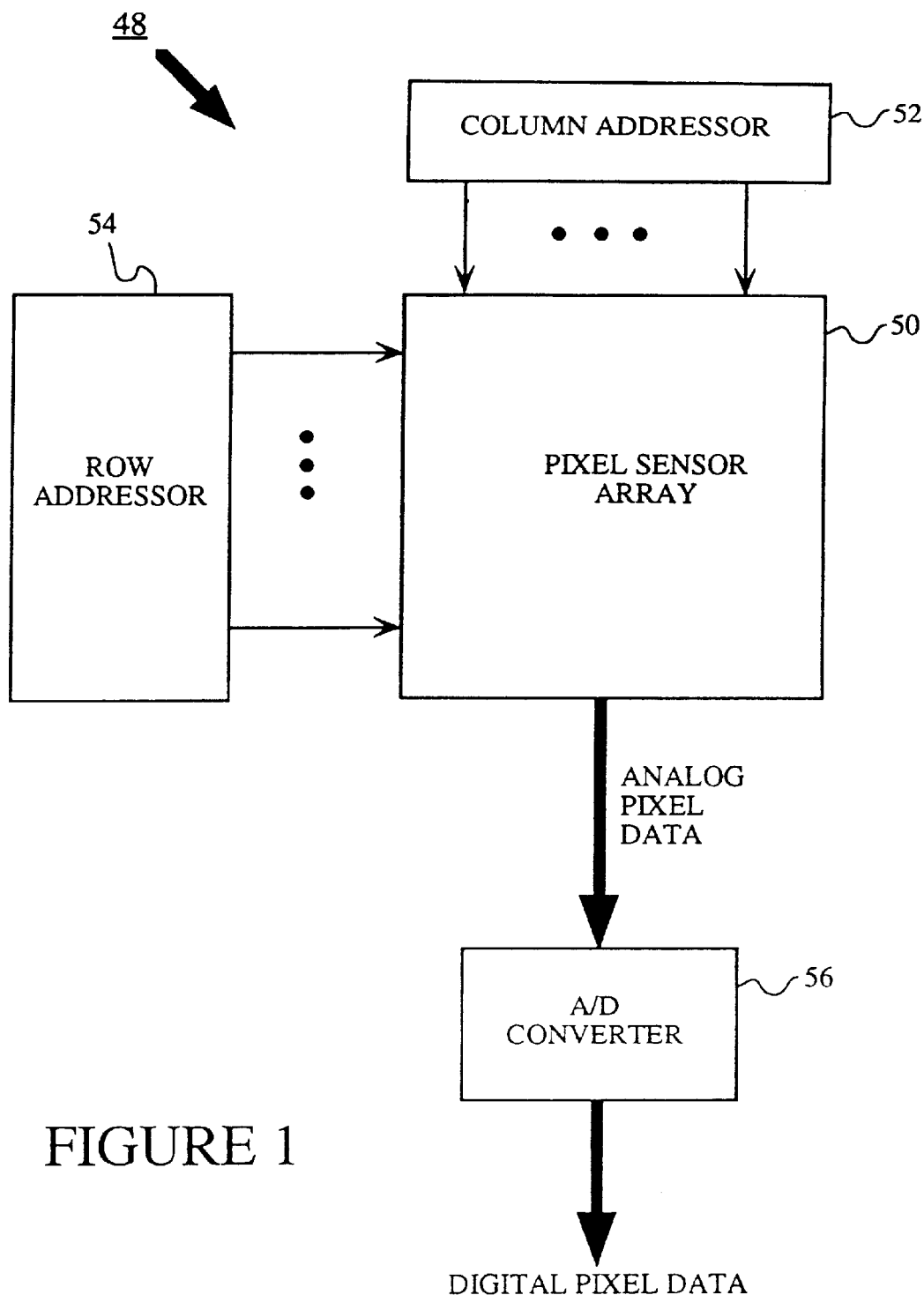
FIG. 1 illustrates an image capture subsystem configured in accordance with one embodiment of the invention.

The present invention provides a method and apparatus for analog-to-digital signal conversion. For purposes of explanation, specific embodiments are set forth to provide a thorough understanding of the present invention. However, it will be understood by one skilled in the art, from reading this disclosure, that the invention may be practiced without these details. Further, although the present invention is described through the use of analog-to-digital conversion for pixel signals, most, if not all, aspects of the invention apply to analog-to-digital signal conversion in general. Moreover, well-known elements, devices, process steps and the like are not set forth in detail in order to avoid obscuring the present invention.

Generally, signal level differences between two neighboring pixels from two consecutive rows or columns are not consecutive pixel signals, an incremental converter may be used that increments only a programmed number of bits rather than converting the whole 8–10 bits.

To avoid converting the whole signal from the beginning to the end, an incremental converter may be used to first convert a first pixel signal, and then a subsequent, second pixel signal that is from a pixel sensor in an adjacent position. The second pixel signal is compared to the first pixel signal to determine if the second pixel signal is larger or smaller than the first pixel signal. If the second pixel signal is larger than the first pixel signal, the binary value generated for the first pixel signal may be incremented by an appropriate number of bits. If the value of the second pixel signal is lower than the value of the first pixel signal, the binary value generated for the first pixel signal is decremented to arrive at the binary value for the second pixel signal. Subsequent pixels are processed by looking at the previous pixel.

In most situations, the difference between two pixel signals does not change by more than three bits. This difference will become smaller when better technologies decreases the size of each pixel (i.e., where the resolution of the pixel array increases). This is due to the fact that the higher the resolution of the pixel array, the more pixels there will be in a unit area and the less pixel surface area over which light may change.

In a preferred embodiment, a single A/D converter is used for converting the signals received from the red pixels, another A/D converter is used for converting the signals received from the green pixels and yet another A/D converter is used for converting the signals received from the blue pixel. Thus, one A/D converter is used for all the pixels for each color in the sensor array. Although one A/D converter may be used to process all the pixel signals in the array, it is desirable to use one A/D converter for each color in the array.

For example, as the signal which comes from a red pixel sensor is usually significantly different from the signal that comes from a green pixel sensor, usually more than 3 bits will need to be changed. This is true even if the pixels are beside each other as they are capturing different parts of the light spectrum. For gray-scale, "black and white"

applications, this limitation does not exist and a single A/D converter may be used for processing all pixel signals if desired.

FIG. 1 is a block diagram of an image capture subsystem 48 containing a pixel sensor array 50, a column addressor 52, a row addressor 54, and an analog-to-digital (A/D) converter 56 which is configured in accordance with one preferred embodiment of the present invention.

Pixel sensor array 50 contains a set of pixel sensors which is used to capture an image by providing analog pixel data to A/D converter 56. In a preferred embodiment, the pixel sensors in pixel sensor array 50 are CMOS pixel sensors. In an alternate embodiment, the pixel sensors in pixel sensor array 50 are charge-coupled-device (CCD) pixel sensors. It is to be noted that any light sensors or intra-red detector may be used in pixel sensor array 50, and is only required to convert light energy or temperature into an electronic representation.

Column addressor 52 and row addressor 54 are used for addressing a specific pixel in pixel sensor array 50. Column addressor 52 will control which column of pixel sensors in pixel sensor array 50 will be chosen to be read, and row addressor 54 will determine which row of pixel sensors in pixel sensor array 50 will be active. Thus, the intersection of the row and column designated by row addressor 54 and column addressor 52 will determine the actual pixel to be read. Column addressor 52 and row addressor 54 receive control signals from a control circuit (not shown), which determines the timing and location of the access.

A/D converter 56, as explained below, receives the analog signals which electrically represents the image captured by pixel sensor array 50. A/D converter 56 converts the received analog signals to digital data suitable for processing in the digital domain. In one preferred embodiment, A/D converter 56 is a single incremental A/D converter capable of converting the total number of pixels in pixel sensor array 50 in sufficient time.

Figure 2:
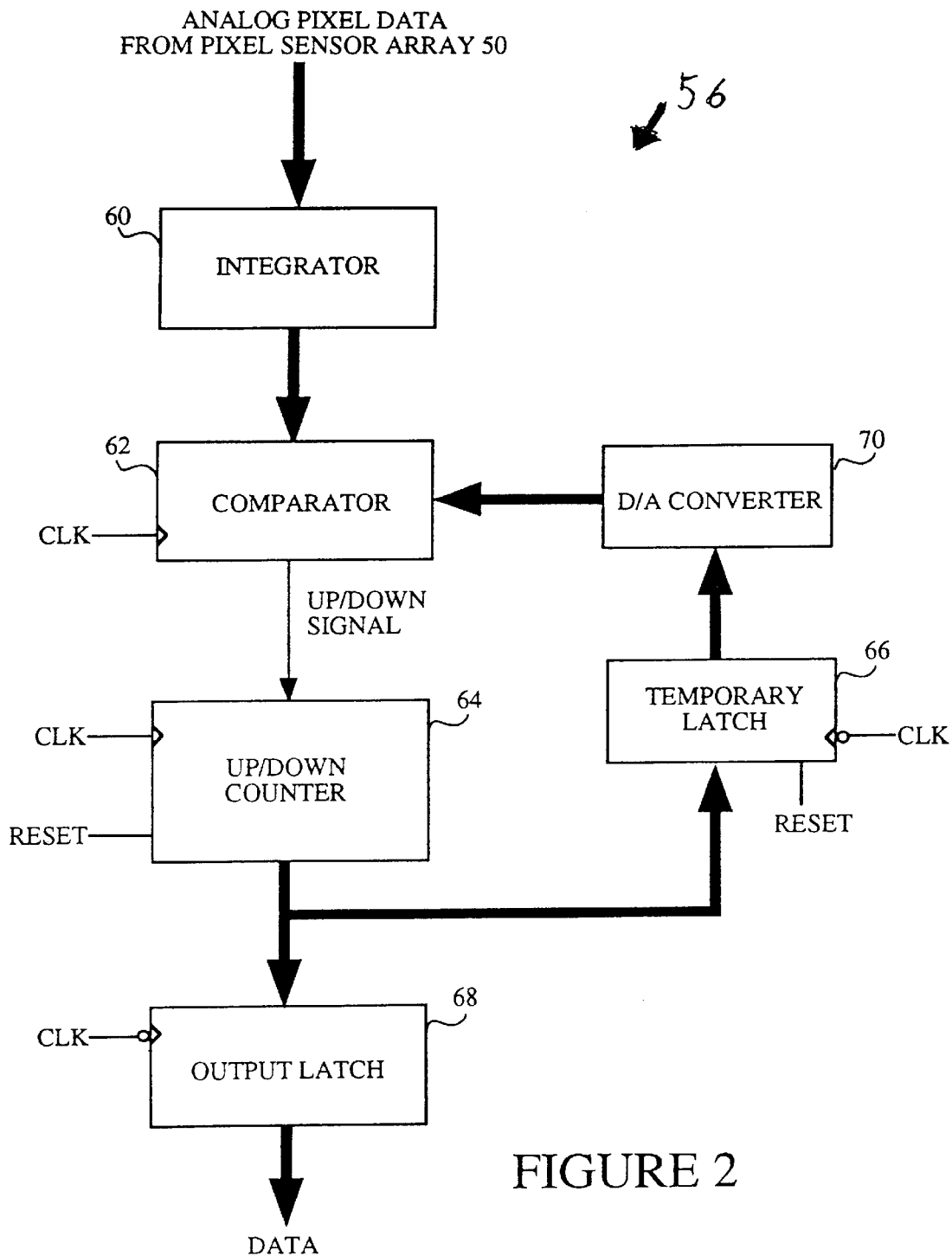
FIG. 2 illustrates an analog to digital converter contained in the image capture subsystem configured in accordance with one embodiment of the invention.

FIG. 2 is a block diagram of A/D converter 56 as configured in accordance with one preferred embodiment of the present invention having an integrator 60, a comparator 62, an up/down counter 64, an output latch 68, a temporary latch 66, and a digital-to-analog (D/A) converter 70.

Integrator 60 is coupled to pixel sensor array 50 and receives the analog pixel data from the output of pixel sensor array 50 when column addressor 52 and row addressor 54 drives out the pixel data for a particular pixel. Integrator 60 is responsible for integrating the analog pixel data received from pixel sensor array 50 and during image capture and sending it to comparator 62.

Comparator 62 receives the output of integrator 60 and also receives the output of D/A converter 70. Comparator 62 compares the two received output signals and outputs a signal to up/down counter 64. Comparator 62 outputs a signal to cause up/down counter 64 to count up if the output of integrator 60 is higher than the output of D/A converter 70. Otherwise, comparator 62 outputs a signal to cause up/down counter 64 to count down. In one embodiment, comparator 62 performs a comparison every clock cycle. The system determines that the value in the counter is equal to the signal from the sensor when the output of the comparator changes signs (e.g., goes from positive to negative or vice versa. Thus, up/down counter 64 generates a binary value based on the incremented or decremented count. The size of the binary value (i.e., the number of bits in the binary value), is determined by the dynamic range needed for a particular application. For one embodiment, up/down counter 64 is a 10-bit counter, which allow the pixel sensor to have a 10 bit dynamic range.

In one embodiment, up/down counter 64 also receives a RESET signal that sets the value contained in up/down counter 64 to a preset value. In one preferred embodiment, the preset value is half of the maximum value obtainable by up/down counter 64. In an alternate embodiment, up/down counter 64 is initialized with another predetermined value, such as a zero value or the maximum value obtainable by up/down counter 64.

As discussed above, when comparator 62 instructs up/down counter 64 to go up or down, the value stored in up/down counter 64 changes by one per each clock cycle. Therefore, the system requires $2^N$ clock cycles to convert a pixel signal of N bits. For example, it takes up to 1,024 ($2^{10}$) clock cycles to change ten bits in a counter. Thus, to change all ten bits of the counter, 1,024 clock cycles are needed. However, if only three bits need to be changed, the maximum of only eight clock cycles (23) are needed, and power and time are saved from not needing to change more bits.

The power consumption of the circuit is decreased because 1,024 clock cycles are not needed to convert an analog signal to a digital value with 10 bits. Using A/D converter 56, which requires fewer clock cycles to convert an analog pixel signal to a digital value, allows not only the power expenditure and space requirements of the imaging circuit to be decreased, but also allows the amount of noise generated to be lessened. The noise that is generated by the imaging circuit is decreased as the circuit is operating at a lower frequency.

Continuing to refer to FIG. 2, an output latch 68 is coupled to the output of up/down counter 64 to receive the value contained in up/down counter 64. Output latch 68 stores the output of up/down counter 64 on the falling edge of the clock signal. By waiting until the falling edge of the clock to store the output of up/down counter 64, the output of up/down counter 64 will have time to stabilize as the value in up/down counter 64 is changed at the rising edge of the clock cycle. Once the data is stored in output latch 68, it may be read out for downstream processing and storage. Output latch 68 refreshes itself when the conversion is done. Output latch 68 also functions as a pipeline register such that as data is shifting out of input latch 68, D/A converter 70 can work on the next sample.

The output of up/down counter 64 is also sent to temporary latch 66, which is used to temporarily store the value received from up/down counter 64. Temporary latch 66 loads the value output by up/down counter 64 on the trailing edge of the clock signal, similar to the timing of the loading of up/down counter 64. Temporary latch 66 is used to store the last value received from up/down counter 64 and to allow D/A converter 70 to generate an analog signal from the digital value of the output of the up/down counter 64. In one preferred embodiment, the characteristics of D/A converter 70 is accounted for to ensure that an analog signal which has been digitized through the use of the present invention is reconverted back to an analog signal with the same value.

Temporary latch 66 also receives a RESET signal which sets the value contained in temporary latch 66 to a preset value. In one preferred embodiment, the preset value is half of the maximum value obtainable by up/down counter 64. In an alternate embodiment, temporary latch 66 is initialized with another predetermined value, such as a zero value or the maximum value obtainable by up/down counter 64.

In an alternate embodiment, incremental A/D conversion may also be implemented for an A/D array where there are multiple A/D converters such as A/D converter 56 which will be used to convert a set of signals in parallel. The number of multiple A/D converters used will depend on the number of signals to be converted at one time.

Figure 3:
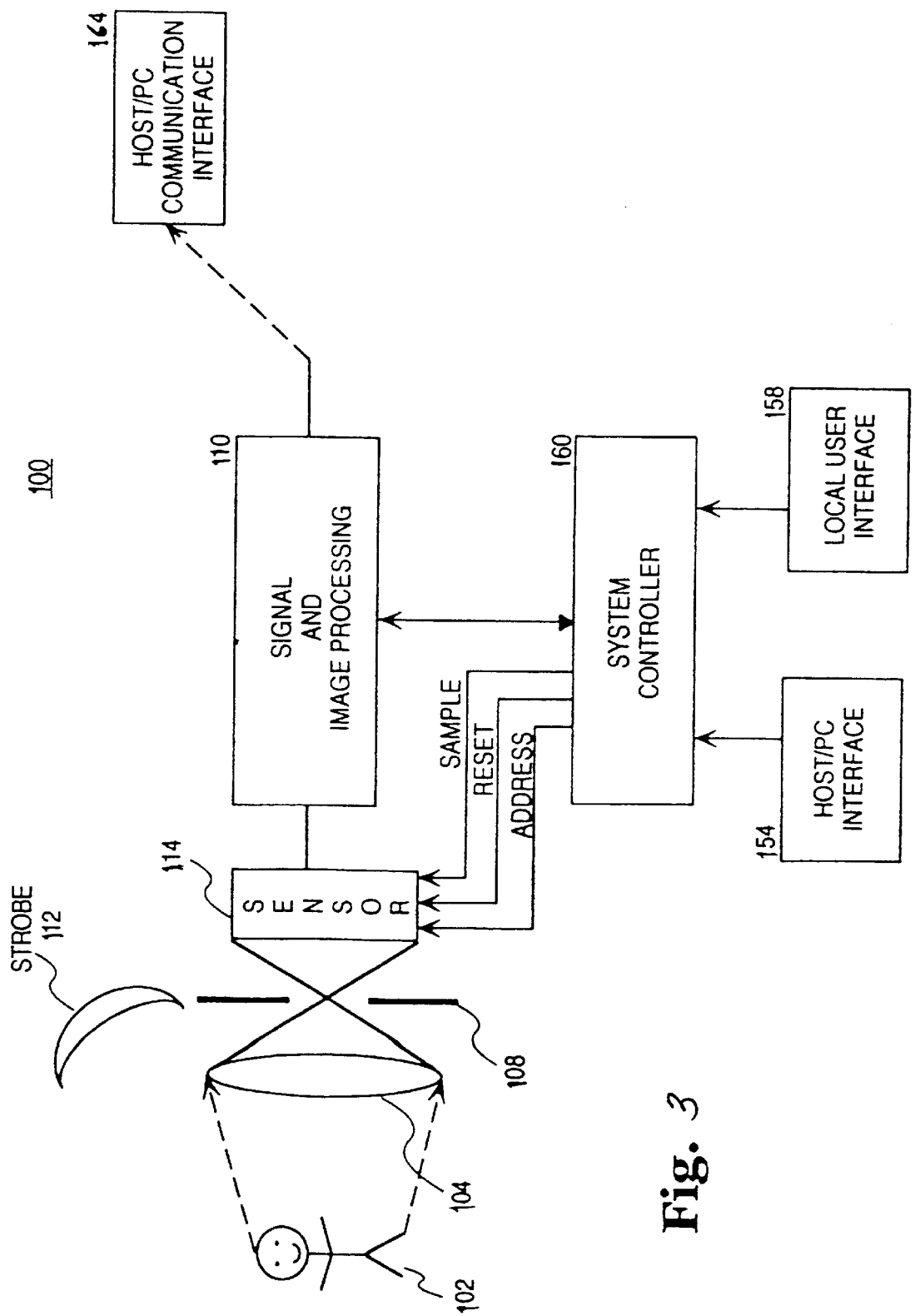
FIG. 3 is a block diagram of an imaging system containing said image capture subsystem configured in accordance with one embodiment of the invention.

An embodiment of the invention as an imaging system 100 is shown as a logical block diagram in FIG. 3. Imaging system 100 includes a number of conventional elements, such as an optical system having a lens 104 and aperture 108 that is exposed to the incident light reflected from a scene or object 102. The optical system properly channels the incident light towards a sensor array 114 that generates sensor signals in response to an image of object 102 being formed on sensor array 114.

The various control signals used in the operation of sensor array 114, such as the RESET signal, the SAMPLE signal, and the ADDRESS signal, is generated by a system controller 160. System controller 160 may include a microcontroller or a processor with input/output (I/O) interfaces that generates the control signals in response to instructions stored in a non-volatile programmable memory. System controller 160 also acts in response to user input via a local user interface 158 (as when a user pushes a button or turns a knob of system 100) and to a host/PC interface 154 to manage the operation of imaging system 100.

To obtain processed images, a signal and image processing block 110 is provided in which hardware and software operates according to image processing methodologies to generate captured image data with a predefined resolution in response to receiving the sensor signals. Optional storage devices (not shown) may be used aboard system 100 for storing the captured image data. Such local storage devices may include a removable memory card. A host/Personal Computer (PC) communication interface 164 is normally included for transferring the captured image data to an image processing and/or viewing system such as a computer separate from imaging system 100. Imaging system 100 may optionally contain a display means (not shown) for displaying the captured image data. For instance, imaging system 100 may be a portable digital camera having a liquid crystal display or other suitable low power display for showing the captured image data.

In one embodiment, sensor array 114 includes the elements described for image capture subsystem 48, with the output of A/D converter 56 going to signal and image processing block 110. Signal and image processing block 110 includes A/D converter 56 for processing the analog pixel data received from sensor 114.

While the present invention has been particularly described with reference to the various figures, it should be understood that the figures are for illustration only and should not be taken as limiting the scope of the invention. Many changes and modifications may be made to the embodiments of the invention by one having ordinary skill in the art, without departing from the spirit and scope of the invention.

What is claimed is:

1. A method comprising:

receiving a first pixel signal;

generating a first set of bits representative of said first pixel signal;

receiving a second pixel signal;

latching said first set of bits;

comparing said second pixel signal with a signal generated from said latched bits to determine whether said second pixel signal is greater than said first pixel signal; and generating a second set of bits representative of said second pixel signal based on a difference between said first pixel signal and said second pixel by using said latched bits as a starting value for calculating said second set of bits.

2. The method of claim 1 wherein said generating a second set of bits further comprises determining a difference between said first pixel signal and said second pixel signal.

3. The method of claim 1 wherein said generating a first set of bits representative of said first pixel signal further comprises converting said first pixel signal from an analog form to a digital form.

4. The method of claim 3 wherein said digital form is a set of binary data bits.

5. An apparatus comprising:

an integrator;

a comparator coupled to said integrator;

a counter coupled to said comparator;

a first latch coupled to said counter;

a second latch coupled to said counter; and a digital-to-analog converter coupled to said comparator.

6. The apparatus of claim 5, wherein said counter is an up/down counter.

7. The apparatus of claim 5, wherein said comparator has a first input coupled to said integrator; a second input coupled to said digital-to-analog converter; and an output coupled to said counter.

8. An imaging system comprising:

a sensor;

an analog-to-digital converter coupled to said sensor, said analog-to-digital converter comprising:

an integrator;

a comparator coupled to said integrator;

a counter coupled to said comparator;

a first latch coupled to said counter;

a second latch coupled to said counter; and a digital-to-analog converter coupled to said comparator.

9. The imaging system of claim 8, wherein said counter is an up/down counter.

10. The imaging system of claim 8, wherein said comparator has a first input coupled to said integrator; a second input coupled to said digital-to-analog converter; and an output coupled to said counter.

11. The method of claim 1 wherein said generating said second set of bits comprises incrementing said latched bits to above said starting value if said second analog pixel signal is greater than said first analog pixel signal.

12. The method of claim 1 wherein said generating said second set of bits comprises decrementing said latched bits to below said starting value if second analog pixel signal is less than said first analog pixel signal.

* * * * *